United States Patent
Chen et al.

(10) Patent No.: US 6,610,571 B1
(45) Date of Patent: Aug. 26, 2003

(54) APPROACH TO PREVENT SPACER UNDERCUT BY LOW TEMPERATURE NITRIDATION

(75) Inventors: Ying-Lin Chen, Taichung (TW); Chiang-Lang Yen, Taichung (TW); Ling-Sung Wang, Hsin-Chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 10/068,929

(22) Filed: Feb. 7, 2002

(51) Int. Cl.$^7$ ............................................. H01L 21/336
(52) U.S. Cl. ..................... 438/265; 438/366; 438/775; 438/791; 438/184; 438/595; 257/384
(58) Field of Search ................... 438/775, 265, 438/791, 366, 445, 184, 230, 710, 723, 595; 257/333, 334, 346, 384, 408

(56) References Cited

U.S. PATENT DOCUMENTS

| | | | |
|---|---|---|---|
| 5,358,879 A | * 10/1994 | Brady et al. ................ 438/163 |
| 5,648,284 A | * 7/1997 | Kusunoki et al. ............ 438/286 |
| 5,847,428 A | * 12/1998 | Fulford, Jr. et al. ........ 257/344 |
| 5,895,955 A | * 4/1999 | Gardner et al. ............ 257/336 |
| 5,939,333 A | 8/1999 | Hurley et al. ............... 437/241 |
| 6,144,071 A | 11/2000 | Gardner et al. ............. 257/344 |
| 6,187,676 B1 | 2/2001 | Kim et al. ................... 438/656 |
| 6,200,868 B1 | 3/2001 | Mase et al. ................. 438/301 |
| 6,350,708 B1 | * 2/2002 | Hurley ........................ 438/791 |
| 6,503,846 B1 | * 1/2003 | Niimi et al. ................. 438/776 |

* cited by examiner

Primary Examiner—David Nelms
Assistant Examiner—Andy Huynh
(74) Attorney, Agent, or Firm—George O. Saile; Stephen B. Ackerman (57) ABSTRACT

A new method is provided for the removal of liner oxide from the surface of a gate electrode during the creation of the gate electrode. A layer of gate oxide is formed over the surface of a substrate, a layer of gate electrode such as polyimide is deposited over the layer of gate oxide. The gate electrode and the layer of gate oxide are patterned. A layer of liner oxide is deposited, gate spacers are formed over the liner oxide, exposing surfaces of the liner oxide. The created structure is nitrided by a plasma stream containing $N_2/H_2$, reducing the etch rate of the exposed liner oxide. The liner oxide is then removed by applying a wet etch, contact regions to the gate electrode are salicided.

11 Claims, 7 Drawing Sheets

APPROACH TO PREVENT SPACER UNDERCUT BY LOW TEMPERATURE NITRIDATION

BACKGROUND OF THE INVENTION

(1) Field of the Invention

The invention relates to the fabrication of integrated circuit devices, and more particularly, to a method to prevent gate spacer undercut in the creation of gate electrode structures.

(2) Description of the Prior Art

Figure 1:
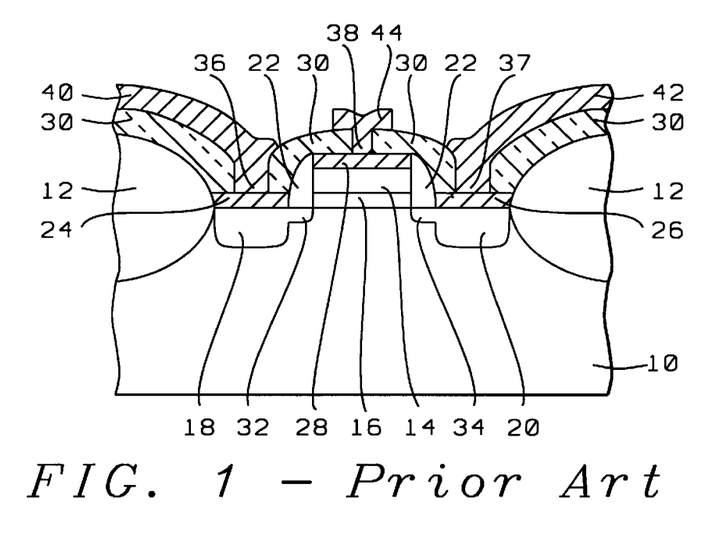
FIG. 1 shows a cross section of a conventional gate electrode.

The art of creating Complementary Metal Oxide Silicon (CMOS) devices is well known in semiconductor technology. FIG. 1 shows a cross section of a conventional CMOS device, the creation of this device will be briefly highlighted using the device elements that are highlighted in FIG. 1. The process of creating a CMOS device starts by providing a semiconductor substrate 10. Insulation regions 12, that bound the active region in the surface of substrate 10, isolate the active region in the surface of substrate 10 and may be created using Oxide (FOX) isolation or Shallow Trench Isolation (STI). A thin layer 16 of gate oxide is grown over the surface of the substrate 10 in the active device region. To create the gate structure, a layer 14 of polysilicon is grown over the thin layer 16 of gate oxide. The polysilicon layer 14 is masked and the exposed polysilicon and the thin layer of oxide are etched to create the polysilicon gate 14 that is separated from the substrate 10 by the remaining thin layer 16 of oxide. The doping of the source/drain regions starts with creating the lightly N+ doped diffusion (LDD) regions 32/34. The sidewall spacers 22 for the gate structure are formed after which the source (18) and drain (20) regions doping is completed by doping these source/drain regions 18/20 to the desired level of conductivity using an impurity implantation.

Low resistivity contact points 24 (to the source 18), 26 (to the drain 20) and 28 (to the electrode gate 14) are then formed by first depositing a layer of titanium or cobalt with TiN over the surface of the source/drain regions and the top surface of the gate electrode. This titanium or cobalt is annealed causing the deposited titanium or cobalt to react with the underlying silicon of the source/gain regions and the doped surface of the gate electrode. This anneal forms layers of titanium silicide or cobalt silicide 24/26 on the surfaces of the source/drain regions and layer 28 on the top surface of the gate electrode. Cobalt with TiN are used to form cobalt salicide in which the TiN serves as a barrier layer.

Metal contacts with the source (40) and drain (42) regions and the gate electrode (44) are formed as a final step. A layer 30 of dielectric, such as silicon oxide, is blanket deposited over the surface of the created structure. This layer of dielectric is patterned and etched to create contact openings 36/37 over the source/drain regions and opening 38 over the top surface of the gate electrode. A metallization layer is deposited over the patterned layer 30 of dielectric, establishing the electrical contacts 40/42 with the source/drain regions and 44 with the top surface of the gate electrode.

The conventional methods that are employed to create CMOS devices address such concerns as the thickness and uniformity of the layer of gate oxide, a shallow junction depths required for the device impurity implantations, the impurity content of the layer of gate dielectric, the dielectric constant of the materials for the gate dielectric, prevention of the migration of impurity implantations (such as boron, implanted into a layer of polysilicon to create the conductivity of the body of the gate electrode) into the channel region of the underlying substrate, causing leakage current of the gate electrode to the substrate, device switching speed and the like.

The invention addresses concerns of damage that is caused to the layer of gate spacer oxide. The layer of gate spacer oxide (also referred to as liner oxide) underlies the gate spacers and is interposed between the body of the gate electrode and the gate spacers, overlying the sidewalks of the body of the gate electrode. An overetch of the layer of gate spacer oxide causes the gate spacer oxide to be partially removed from below the gate spacer, creating an undercut below the gate spacer. Methods are provided by the invention to prevent this undercut.

U.S. Pat. No. 6,200,868 B1 (Mase et al.) shows a nitridation process to prevent gate spacer undercut.

U.S. Pat. No. 6,187,676 (Kim et al.) shows a nitridation process to cover an undercut.

U.S. Pat. No. 6,144,071 (Gardner) shows a related method.

SUMMARY OF THE INVENTION

It is the primary objective of the invention to reduce undercut in the layer of gate spacer oxide of a gate electrode.

Another objective of the invention is to improve isolation of the gate electrode.

Yet another objective of the invention is to prevent the accumulation of semiconductor materials or foreign particles in openings created under the gate spacers of a gate electrode.

In accordance with the objectives of the invention a new method is provided for the removal of liner oxide from the surface of a gate electrode during the creation of the gate electrode. A layer of gate oxide is formed over the surface of a substrate, a layer of gate electrode such as polyimide is deposited over the layer of gate oxide. The gate electrode and the layer of gate oxide are patterned. A layer of liner oxide is deposited, gate spacers are formed over the liner oxide, exposing surfaces of the liner oxide. The created structure is nitrided by a plasma stream containing $N_2/H_2$, reducing the etch rate of the exposed liner oxide. The liner oxide is then removed by applying a wet etch, contact regions to the gate electrode are salicided.

BRIEF DESCRIPTION OF THE DRAWINGS

FIGS. 11 through 15 show the processing of the invention, specifically:

DESCRIPTION OF THE PREFERRED EMBODIMENTS

Figure 2:
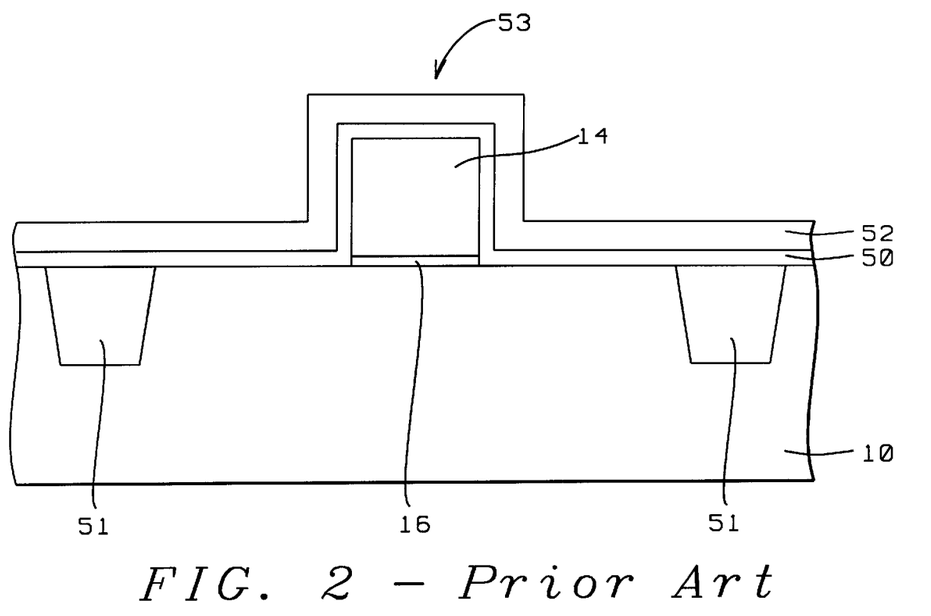
FIGS. 2 through 4 show the occurrence of an undercut in a layer of liner oxide that is created between a gate spacer and the body of a gate electrode.

The creation of a conventional CMOS device has previously been highlighted using the cross section of FIG. 1. An alternate method of creating a gate electrode is shown in the cross section of FIG. 2. Specifically shown in the cross section of FIG. 2 are:

51, two STI regions defined in the surface of the substrate 10, these STI Regions 51 electrically isolate the gate electrode 53 from other semiconductor devices (not shown) that have been created over substrate 10

53, a CMOS device created over substrate 10

14, a layer of gate material of the gate electrode of the CMOS device 53, typically comprising polysilicon 16, a layer of pad or gate oxide that has been formed over substrate 10

50, a layer of liner oxide, deposited over the substrate, including the gate electrode 53

52, a layer of nitride, deposited over the layer 50 of liner oxide.

Typically, a blanket layer 16 of pad oxide can be formed over the surface of a silicon substrate through a thermal oxidation method at a temperature of about 900 degrees C. for a time period of about 10 to 20 minutes. A layer 16 of pad oxide is typically formed to a thickness of between about 50 and 150 Angstrom.

For the creation of a typical gate electrode, such as gate electrode 53 shown in cross section in FIG. 2, a layer 14 of polysilicon is deposited over the layer 16 of gate oxide and etched using photolithography followed by anistropic poly etch. The etch to form the body 14 of the gate electrode 53 removes the layer of poly and the layer of gate oxide from above the surface of substrate 10 in accordance with the pattern of the gate electrode 53.

After layers 14 and 16 have been patterned and etched, a self-aligned LDD implantation (not shown, shown as implantations 32/34 in FIG. 1) is performed into the surface of the substrate 10.

Layer 50, FIG. 2, is an oxide liner, layer 52 is a layer of silicon nitride. Combined, the layers 50 and 52 form a passivation layer over the surface of the substrate 10 and the gate electrode 53. Passivation layers typically contain an oxide or nitride, they can also contain $SiO_2$ that is deposited by plasma at low temperatures, a SACVD oxide layer, a plasma enhanced nitride layer or a LPCVD oxide. Silicon nitride is used as a passivation layer due to its ability to provide an impermeable barrier to moisture and mobile impurities (e.g. sodium ions). Silicon nitride also forms a tough coating that protects an underlying integrated circuit against mechanical damage.

Layer 50 of liner oxide is native oxide or thermally grown oxide or CVD deposited oxide, to a thickness of between about 100 and 500 Angstrom, layer 52 of nitride is deposited next.

Layer 52 of silicon nitride is deposited over the surface of the liner oxide layer 50. The layer 52 of silicon nitride ($Si_3N_4$) can be deposited using LPCVD or PECVD procedures at a pressure between about 300 mTorr and 400 mTorr, at a temperature between about 600 and 800 degrees C., to a thickness of between about 2,000 and 3,000 Angstrom using $NH_3$ and $SiH_4$. The silicon nitride layer 52 can also be deposited using LPCVD or PECVD procedures using a reactant gas mixture such as dichlorosilane ($SiCl_2H_2$) and amonia ($NH_3$)

Gate spacers for gate electrodes are typically created using a variety of materials such as silicon oxide, BSG, PSG, other materials preferably of a dielectric nature and CVD oxide formed from a TEOS source.

Figure 3:
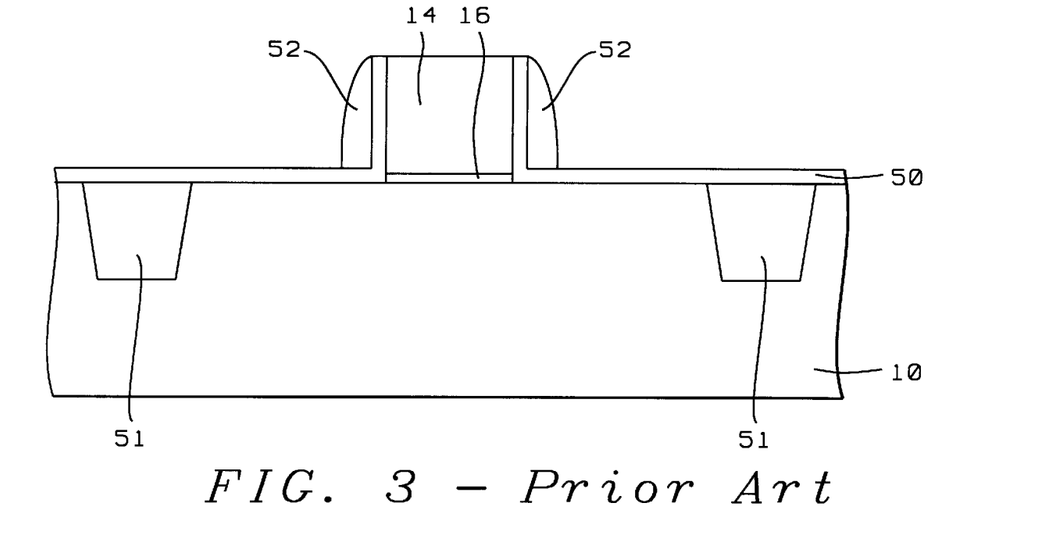

FIG. 3 shows a cross section of the structure of FIG. 2 after the layer 52 of silicon nitride has been etched, stopping on the layer 50. Shown in FIG. 3 are spacers 52 of silicon nitride created on the sidewalls of the gate electrode 53. The preferred method of the invention for the etch of the layer 52 of silicon nitride is a dry etch such as applying an RIE etch using $CHF_3$ or $SF_6$—$O_2$ as an etchant. After the gate spacers 52 have been created as shown in cross section in FIG. 3, the layer 50 of liner oxide must be removed from the surface of substrate 10 where the surface of this layer 50 is exposed. This process of removal can be performed by etching layer 50 (FIG. 3) using $Ar/CF_4$ as an etchant at a temperature of between about 120 and 160 degrees C. and a pressure of between about 0.30 and 0.40 Torr for a time of between about 33 and 39 seconds using a dry etch process. Silicon oxide layer 50 can also be etched via anisotropic RIE of the silicon oxide layer 50, using $CHF_3$ or $CF_4$—$O_2$—He as an etchant.

Figure 4:
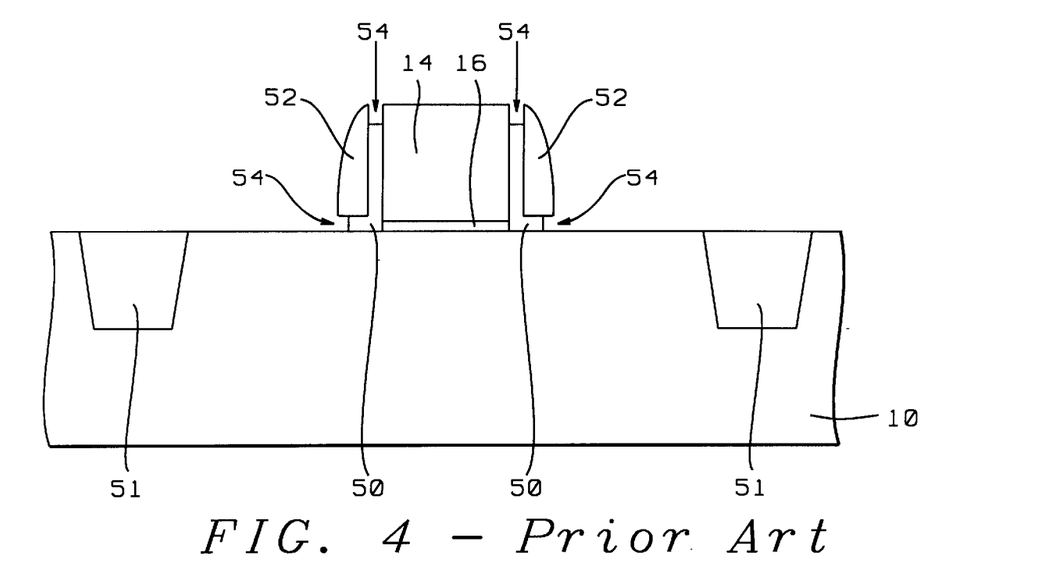

The results of this latter etch are shown in cross section in FIG. 4. Specifically highlighted in the cross section of FIG. 4 are regions 54 which are the regions where the etched layer 50 of liner oxide is attacked by the etch to the point where the etch proceeds underneath the gate spacers 52, resulting in loss of liner oxide in the interface between the gate spacers 52 and the body 14 of the gate electrode 53 and in the interface between the gate spacer 52 and the substrate 10. Due to the loss of liner oxide in these regions 54, device isolation and device performance is negatively affected, this loss of liner oxide must therefore be avoided. The invention provides a method that results in avoiding the loss of liner oxide in regions 54 of the created gate electrode.

Various processing steps are further conventionally performed to improve gate spacer performance, these processing steps will be briefly highlighted in the following FIGS. 5 through 10.

Figure 5:
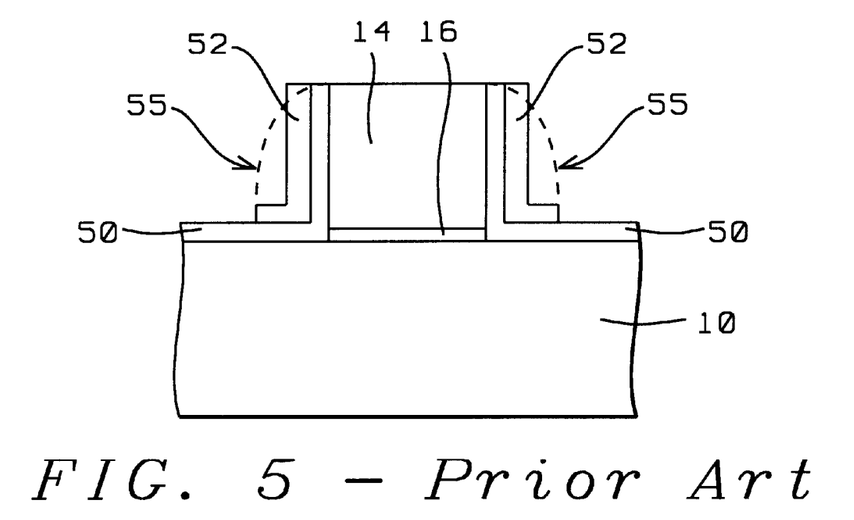
FIGS. 5 through 7 show a first sequence of creating salicided contact regions to a gate electrode and the effect of an undercut in the layer of liner oxide thereon.

FIG. 5 shows the now familiar cross section of a gate electrode, spacers 52 of silicon nitride have been formed over the sidewalls of the gate electrode with a layer 50 of liner oxide being interposed between the silicon nitride gate spacers 52 and the body 14 of the gate electrode. The etch of layer 52 of silicon nitride and the layer 50 of liner oxide over the surface of the gate electrode, FIG. 5, has resulted in an accumulation of the liner oxide 50 in a profile that is highlighted with the boundary lines 55. This liner oxide must as yet be removed from the surface in addition to removing the liner oxide 50 where this liner oxide overlies the surface of substrate 10.

Figure 6:
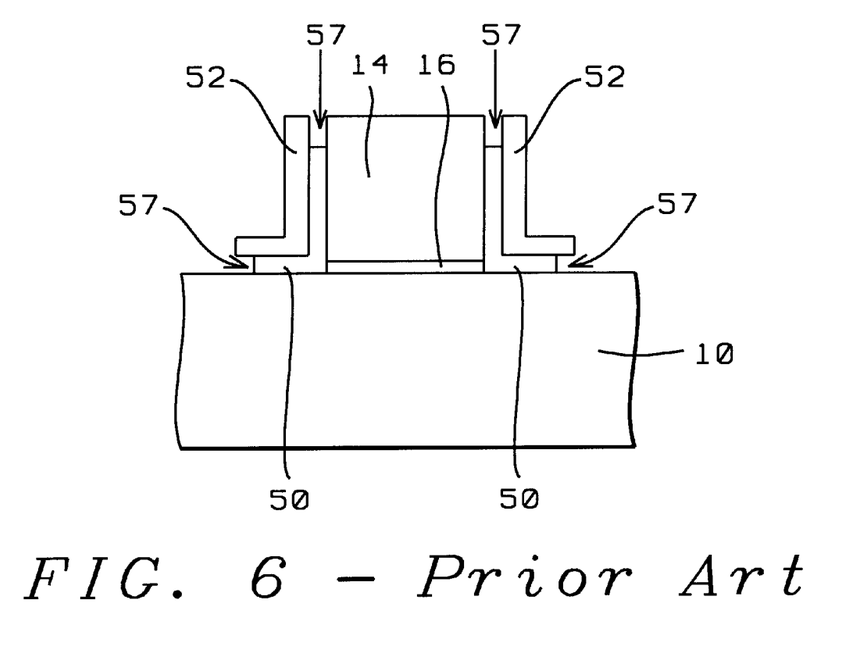

This removal of liner oxide 50 can be performed by applying a wet etch process to the exposed surface of the structure, resulting in a cross section that is shown in FIG. 6. The liner oxide 50 has been removed from the surface of the created gate spacers 52 of silicon nitride but, as a negative consequence of this removal, an undercut 57 (four such undercuts are highlighted in the cross section of FIG. 6) into the liner oxide 50 and located underneath the gate spacers 52 is also created. The undercut 57 has been measured to penetrate about 300 Angstrom underneath the etched layer 52 of silicon nitride gate spacer, the height of the gate spacers 52 is about equal to the height of the body 14 of the gate electrode measured in a direction that is perpendicular to the surface of substrate 10. This measure of 300 Angstrom gives an approximate indication of how far the next to be created layer of salicidation material will penetrate underneath the gate spacers 52 in a downward direction along the sidewalls of the body 14 of the gate electrode.

Figure 7:
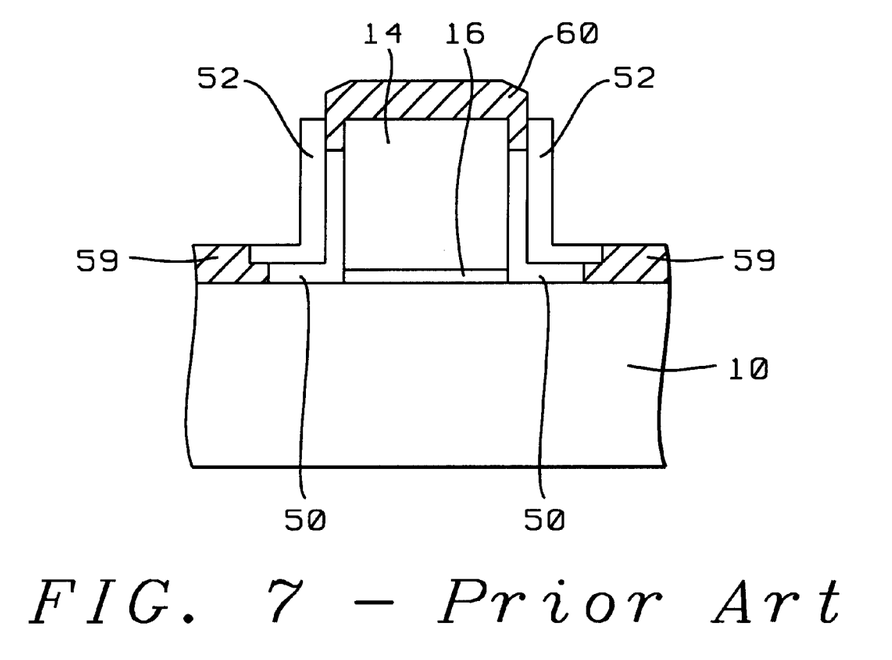

Saliciding the contact surfaces of the gate electrode, using for instance cobalt as a salicidation material, results in creating the salicided surfaces 59, FIG. 7, to the source/drain surfaces of the gate electrode and salicided surface 60 to the body 14 of the gate electrode. It is clear from the cross section that is shown in FIG. 7 that the salicidation material, in the cited example being $CoSi_x$, penetrates underneath the gate spacers 52.

To further improve device performance, by decreasing sheet resistance of the salicided region 60 of FIG. 7, the salicided layer can be increased. This is shown in the cross sections of FIGS. 7 through 10.

Figure 8:
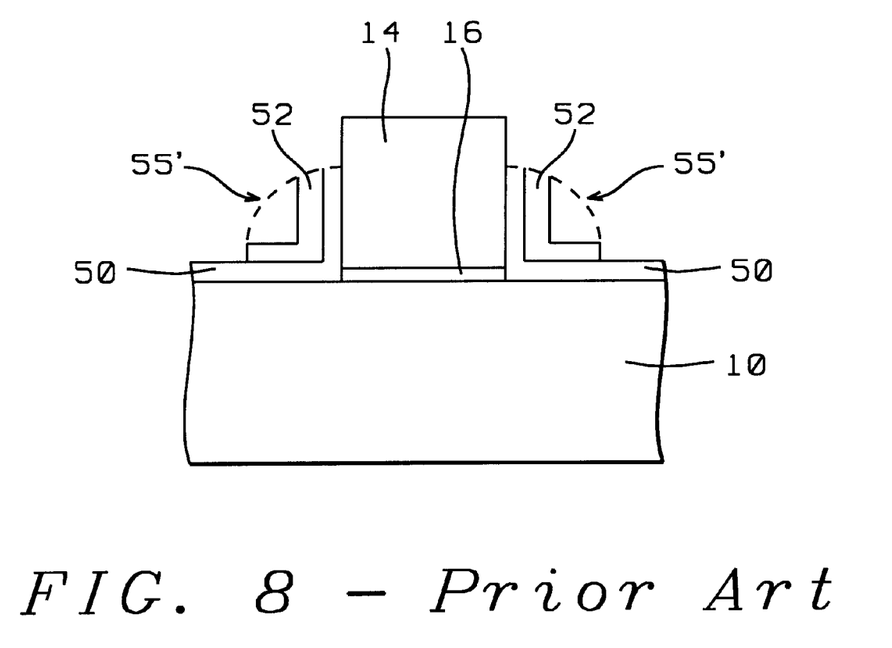
FIGS. 8 through 10 show a second sequence of creating salicided contact regions to a gate electrode and the effect of an undercut in the layer of liner oxide thereon.

The cross section of FIG. 8 shows how the height of the silicon nitride gate spacers 52 is further reduced with respect to the height of layer 14 of the body of the gate electrode, liner oxide 50 is now accumulated bounded by line 55' of the cross section of FIG. 8. The difference in height between the gate spacers 52 and the top surface of the body 14 of the gate electrode has been measured as being about 600 Angstrom, this difference has to be compared with the previously cited difference in height (FIG. 6) of about 300 Angstrom in order to get an appreciation for the potential increase in the size of the salicided layer 60 and the therewith associated reduction in sheet resistance of this salicided layer.

Figure 9:
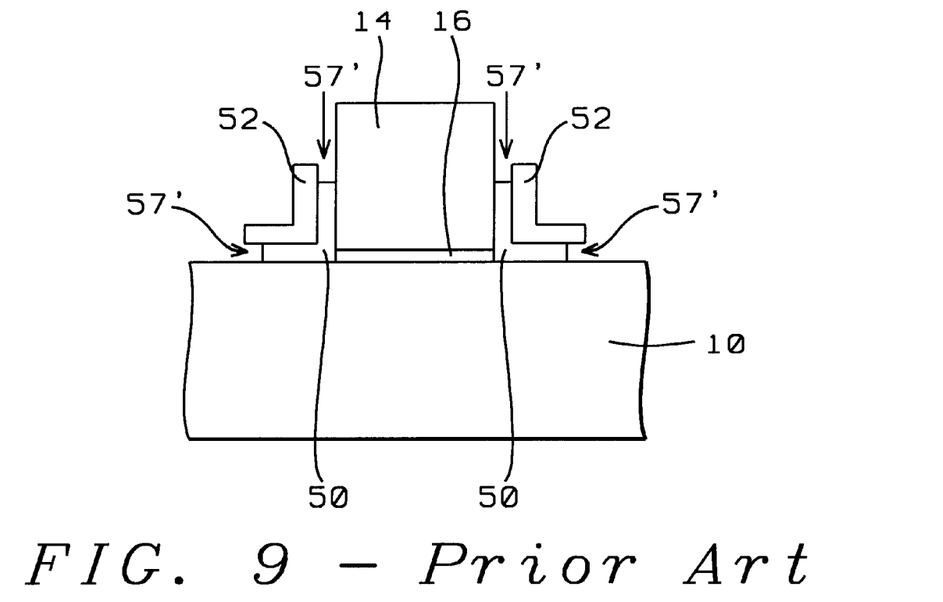

The liner oxide 50, FIG. 8, is next removed, again applying a wet process to the surface of the structure, resulting in the cross section that is shown in FIG. 9. An undercut 57' is again experienced, now creating the salicided contact surfaces 59' and 601 of the gate electrode as shown in the cross section of FIG. 10.

Figure 10:
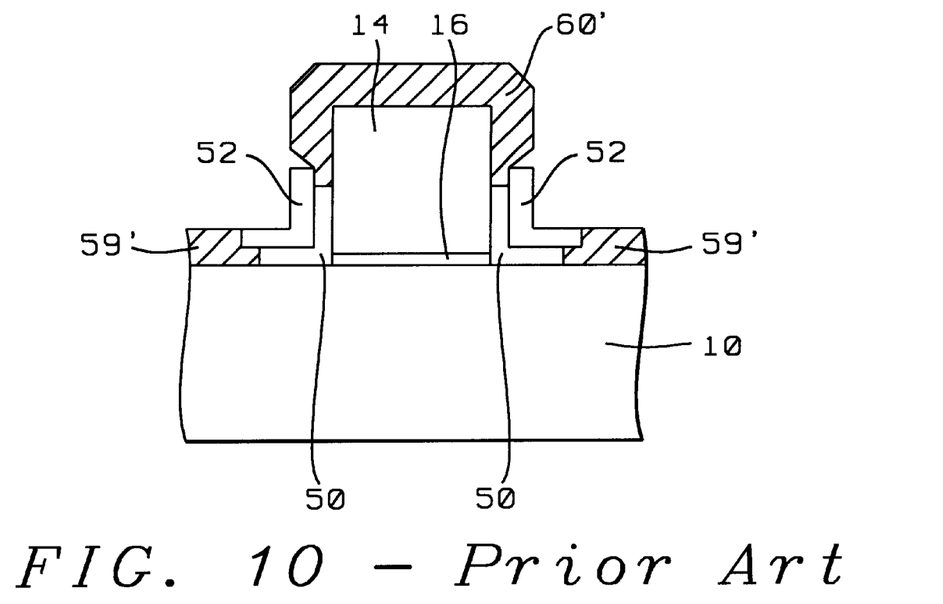

It is clear in comparing the cross section of FIG. 7, where a first salicided layer 60 over the top surface of the gate electrode is shown, with the cross section of FIG. 10, where a second salicided layer 60' over the top surface of the gate electrode is shown, that the second salicided layer 60' is considerably larger than the first salicided layer 60. From this it can be concluded that the contact resistance to the top surface of the gate electrode that is shown in cross section in FIG. 10 is considerably lower than the contact resistance to the top surface of the gate electrode that is shown in cross section in FIG. 7.

While therefore the procedure that is highlighted with the cross sections of FIGS. 8 through 10 results in improved device performance, this improved device performance results in having created salicided layers that are now located in extreme proximity to the layer 16 of gate oxide of the gate electrode. The invention provides a method that negates this incurred disadvantage. This is explained in detail in the following FIGS. 11 through 15.

Figure 11:
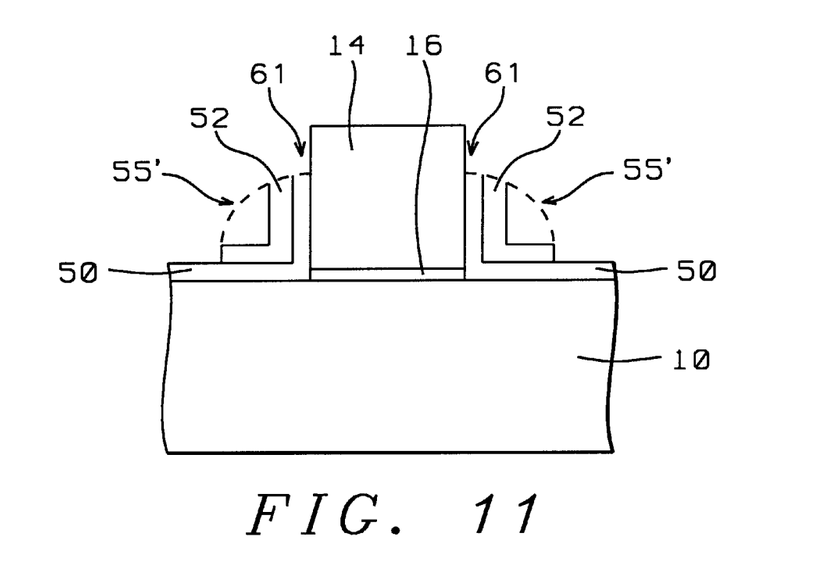
FIG. 11 shows a cross section of a gate electrode, a layer of liner oxide has been deposited, gate spacers of reduced height haves been created over sidewalls of the gate electrode.

FIG. 11 will be recognized as being the same cross section as the cross section that has previously been discussed under FIG. 8 and does therefore not need any further discussion at this time. FIG. 11 is shown at this time since it is the structure of the gate electrode that must first be formed before the unique processing steps of the invention are performed.

Layer 16 of gate oxide is preferably created to a thickness between about 50 and 150 Angstrom, layer 14 of gate material preferably comprises polysilicon and is preferably deposited to a thickness between about 3,000 and 7,000 Angstrom, the layer of gate spacer material that is deposited for the formation of gate spacers 52 preferably comprises silicon nitride and is preferably deposited to a thickness between about 2,000 and 3,000 Angstrom, the layer 50 of liner oxide is preferably created to a thickness between about 100 and 500 Angstrom.

What must be emphasized in the cross structure that is shown in FIG. 11 is that the top surface of the liner oxide 50, where this liner oxide 50 is present over the sidewalls of the body 14 of the gate electrode and is interspersed between the gate spacers 52 and layer 14, is exposed in surface area 61. This is of importance since this offers the opportunity to specially treat this exposed surface 61 of the layer of liner oxide.

Figure 12:
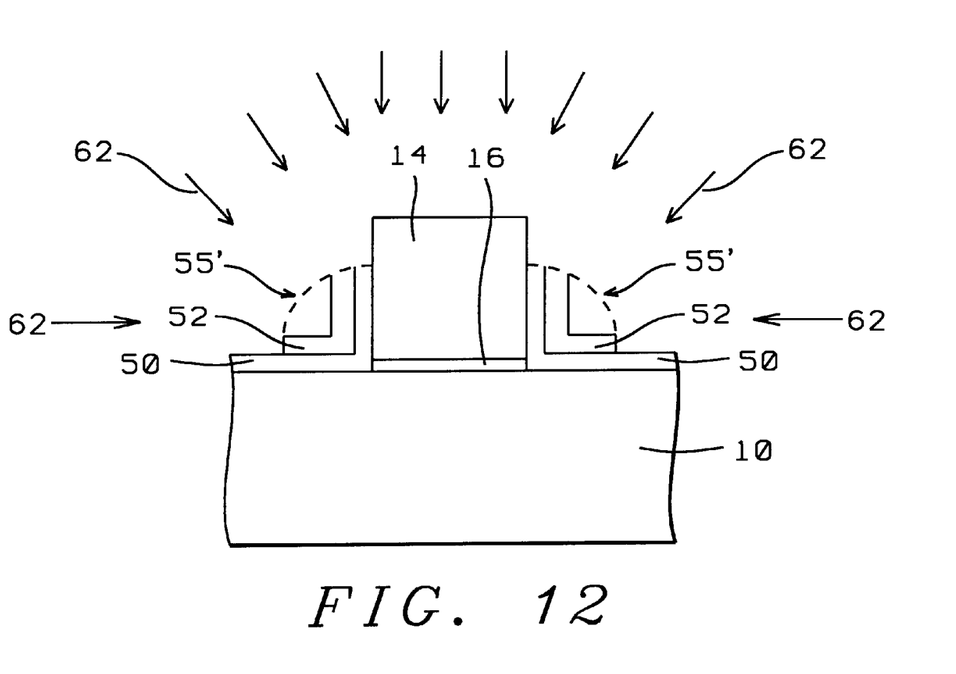
FIG. 12 shows the gate electrode during the application of an $N_2/H_2$ plasma to the exposed surfaces.

The special treatment of the exposed surface of the layer of gate oxide 50 is highlighted in the cross section of FIG. 12, where exposed surfaces of the structure that is shown in cross section in FIG. 11 are nitrided by being exposed to a down-stream $N_2/H_2$ plasma. This plasma exposure 62 results in significantly reducing the etch rate of the liner oxide, which for instance can be TEOS. It has been experimentally confirmed that the $N_2/H_2$ plasma treatment, which is preferably a low temperature treatment performed at a temperature of about 250 degrees C., reduces the etch rate of the liner oxide by about 35 to 36%. If $SiO_x$ is used as the material of choice for the oxide liner, the $N_2/H_2$ plasma treatment will isotropically nitridize the $SiO_x$ to $SiO_xN_y$, which results in reducing the rate at which the liner oxide will be removed during subsequent processing.

Figure 13:
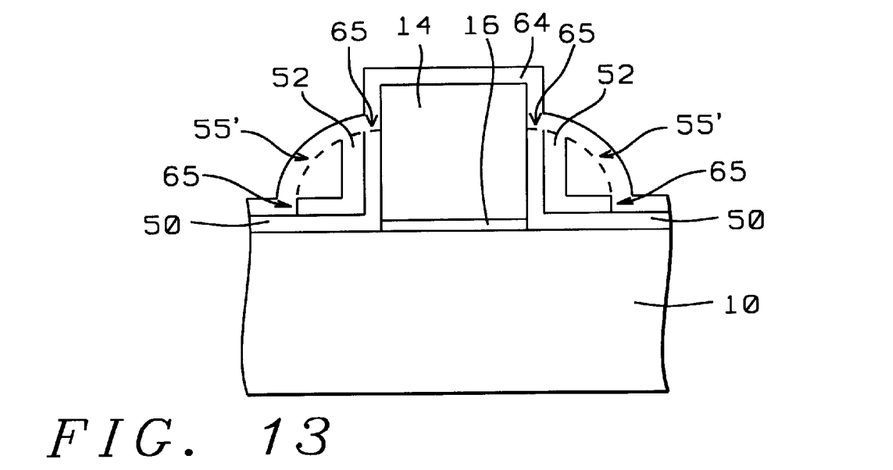
FIG. 13 shows a cross section of a protective layer that has been formed over the exposed surfaces of the structure by the $N_2/H_2$ plasma.

The $N_2/H_2$ plasma treatment will therefore effectively create a layer 64, FIG. 13, of for instance $SiO_xN_y$, over the exposed surfaces of the structure that is shown in cross section in FIG. 12. This is of special significance for the regions that have been highlighted as regions 65 in the cross section of FIG. 13, since these are the regions where the problem of undercut has previously been experienced.

The exposed surfaces of the cross section that is shown in FIG. 13 are now again wet etched, with the created layer 64 acting as a protective layer against the typically experienced undercut. Small spacer protection is in this manner provided in regions 65, FIG. 13, eliminating the undercut phenomenon. The cross section of the structure, after completion of the exposure to wet etch of the structure of FIG. 13, is shown in FIG. 14.

Figure 14:
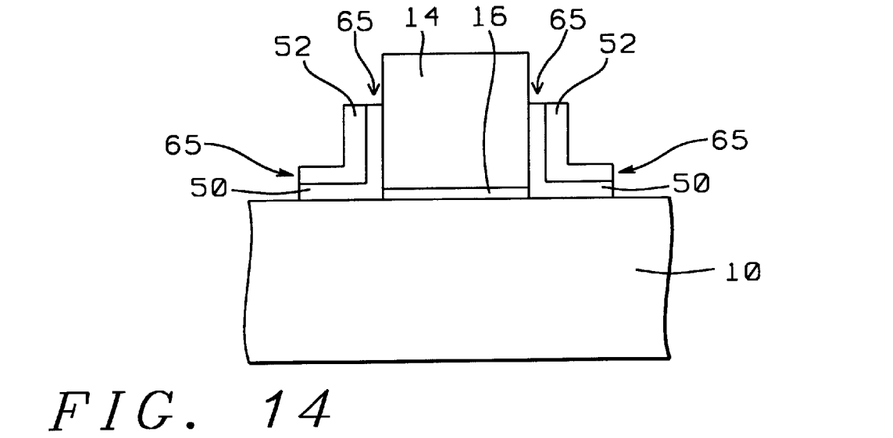
FIG. 14 shows a cross section after removal of the liner oxide from the exposed surfaces.

The structure of FIG. 14 is now ready for the creation of salicided contact surfaces over the gate electrode. The results of this salicidation process are shown in the cross section of FIG. 15. Region 60" has been highlighted as the salicided contact to the top of the gate electrode while regions 59" have been highlighted as the salicided surfaces of the source/drain regions of the gate electrode.

Figure 15:
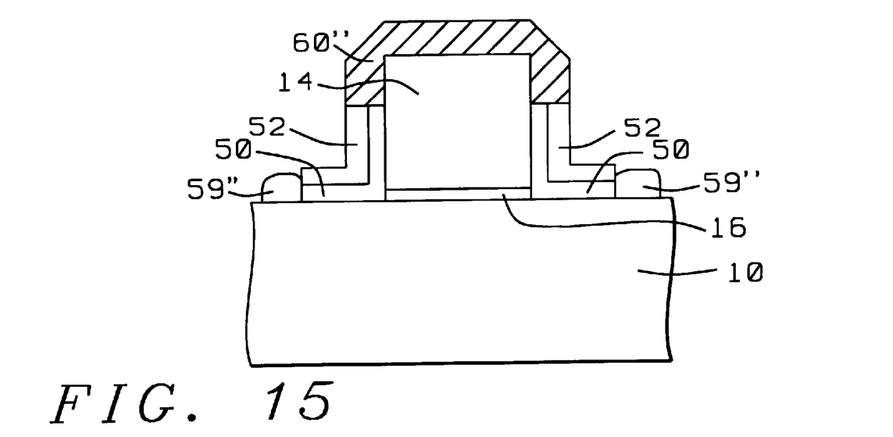
FIG. 15 shows a cross section after salicided contact surfaces have been formed for the gate electrode.

Since, for reasons cited above, the salicided surfaces cannot enter underneath the gate spacers 52, while at the same time maintaining a relatively large salicided region 60", the advantage of improved gate performance (by means of reduced sheet resistance) has been gained without incurring potential problems of electrical discharge from the created salicided surfaces, most notably the salicided top surface of the gate electrode, to the layer of gate oxide of the gate electrode, resulting in damage to the layer of gate oxide of the gate electrode.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A method of creating a gate electrode, comprising the steps of:

providing a substrate, active surface regions having been defined in the surface of the substrate;

creating a layer of gate oxide over the surface of the substrate;

depositing a layer of gate material over the surface of the substrate;

creating a gate electrode structure;

creating a layer of liner oxide over the surface of said substrate, including sidewalls and the surface of said gate electrode;

depositing a layer of gate spacer material over the surface of said layer of liner oxide;

creating gate spacers over sidewalls of said gate electrode, thereby removing said layer of liner oxide from the surface of from sidewalls of said gate electrode where said layer of liner oxide is not covered with said gate spacers, exposing first surfaces of said layer of liner oxide where said liner oxide is interposed between said layer of gate material and said gate spacers and where said liner oxide is furthest removed from the surface of said substrate, further exposing a second surface of said layer of liner oxide where said layer of liner oxide overlies the surface of said substrate;

performing nitridation of said exposed first and second surfaces of said layer of liner oxide, creating a layer of silicon-oxy-nitride overlying the surface and exposed sidewalls of said gate electrode, further overlying said gate spacers and said exposed first and second surfaces of said layer of liner oxide;

removing said layer of silicon oxy-nitride; and saliciding contact points to said gate electrode.

2. The method of claim 1, said layer of gate oxide being created to a thickness between about 50 and 150 Angstrom.

3. The method of claim 1, said layer of gate material comprising polysilicon.

4. The method of claim 1, said gate material being deposited to a thickness between about 3,000 and 7,000 Angstrom.

5. The method of claim 1, said gate spacer material comprising silicon nitride.

6. The method of claim 1, said gate spacer material being deposited to a thickness between about 2,000 and 3,000 Angstrom.

7. The method of claim 1, said layer of liner oxide being created to a thickness between about 100 and 500 Angstrom.

8. The method of claim 1, said nitridation being a $N_2/H_2$ plasma exposure.

9. The method of claim 8, said $N_2/H_2$ plasma exposure being performed at a temperature of about 250 degrees C.

10. The method of claim 1, said liner oxide comprising silicon oxide, said nitridation comprising a $N_2/H_2$ plasma treatment, thereby isotropically nitridizing the silicon oxide of said liner oxide to silicon oxy-nitride.

11. The method of claim 1, said saliciding contact points to said gate electrode being a cobalt base process of salicidation.

* * * * *